US011885022B2

(12) United States Patent
Mori et al.

(10) Patent No.: US 11,885,022 B2
(45) Date of Patent: Jan. 30, 2024

(54) METHOD OF FORMING A FILM ON A SUBSTRATE BY CHEMICAL VAPOR DEPOSITION

(71) Applicant: SHIN-ETSU CHEMICAL CO., LTD., Tokyo (JP)

(72) Inventors: Chikara Mori, Annaka (JP); Waichi Yamamura, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 17/670,832

(22) Filed: Feb. 14, 2022

(65) Prior Publication Data
US 2022/0170153 A1 Jun. 2, 2022

Related U.S. Application Data
(62) Division of application No. 16/418,142, filed on May 21, 2019.

(30) Foreign Application Priority Data
May 23, 2018 (JP) ................. 2018-098575

(51) Int. Cl.
C23C 16/458 (2006.01)
C23C 16/26 (2006.01)
C23C 16/32 (2006.01)
C23C 16/30 (2006.01)

(52) U.S. Cl.
CPC .......... C23C 16/4588 (2013.01); C23C 16/26 (2013.01); C23C 16/30 (2013.01); C23C 16/303 (2013.01); C23C 16/32 (2013.01); C23C 16/458 (2013.01)

(58) Field of Classification Search
CPC ..................... C23C 16/458; C23C 16/4588
See application file for complete search history.

(56) References Cited

U.S. PATENT DOCUMENTS

| | | | | |
|---|---|---|---|---|
| 5,766,363 A * | 6/1998 | Mizuno | ............... | C23C 16/4585 118/728 |
| 5,858,100 A * | 1/1999 | Maeda | ................. | C23C 16/4586 118/728 |
| 8,230,806 B2 * | 7/2012 | Inoue | ....................... | C23C 16/56 118/724 |
| 2001/0037761 A1 | 11/2001 | Ries et al. | | |
| 2003/0033116 A1 * | 2/2003 | Brcka | ................. | H01L 21/6831 702/182 |
| 2005/0155823 A1 | 7/2005 | Hiroki | | |
| 2006/0017055 A1 * | 1/2006 | Cropper | ............... | H10K 50/165 257/E21.042 |
| 2008/0176415 A1 | 7/2008 | Kim | | |
| 2009/0291610 A1 * | 11/2009 | Sasaki | ..................... | C23C 14/50 445/24 |
| 2010/0126419 A1 | 5/2010 | Jang et al. | | |
| 2010/0167224 A1 | 7/2010 | Nakano | | |
| 2010/0186669 A1 | 7/2010 | Shin et al. | | |
| 2010/0224482 A1 * | 9/2010 | Yamaguchi | ......... | C23C 14/0036 204/192.15 |
| 2012/0045593 A1 * | 2/2012 | Yamazaki | ........... | C23C 16/5096 427/579 |
| 2012/0148375 A1 * | 6/2012 | Tashiro | ............... | H01L 21/6719 414/217 |
| 2012/0204796 A1 * | 8/2012 | Ruda Y Witt | ........ | C23C 16/481 118/728 |
| 2013/0287949 A1 | 10/2013 | Cho | | |
| 2014/0318454 A1 | 10/2014 | Tamagaki et al. | | |
| 2015/0240357 A1 * | 8/2015 | Tachibana | ........... | C23C 16/4586 118/725 |
| 2017/0260624 A1 * | 9/2017 | Sufan | ................ | H01L 21/68735 |
| 2017/0323815 A1 * | 11/2017 | Kuenanz | ................. | C23C 14/34 |

FOREIGN PATENT DOCUMENTS

| | | | |
|---|---|---|---|
| DE | 102011055061.5 | * 12/2012 | ............. C23C 16/46 |
| JP | 50-33184 | 3/1975 | |
| JP | 58-125608 A | 7/1983 | |
| JP | 61-124572 | 6/1986 | |
| JP | 63-134663 | 6/1988 | |
| JP | 1-205076 A | 8/1989 | |
| JP | 4-246176 A | 9/1992 | |
| JP | 5-206032 A | 8/1993 | |
| JP | 8-100265 | 4/1996 | |
| JP | 10-83965 A | 3/1998 | |

(Continued)

OTHER PUBLICATIONS

Pasternak, Iwona, et al., "Graphene growth on Ge(100)/ Si(100) substrates by CVD method". Scientific Reports 6:21773, Feb. 2016, pp. 1-7.*

(Continued)

*Primary Examiner* — Bret P Chen

(74) *Attorney, Agent, or Firm* — Oblon, McClelland, Maier & Neustadt, L.L.P.

(57) ABSTRACT

A film may be formed on a surface of a substrate by chemical vapor deposition in a reaction container provided with at least a first holding member that is capable of holding the substrate and a second holding member that is capable of holding the substrate independently from the first holding member, by:

(a) forming a film on the surface of the substrate by chemical vapor deposition while holding the substrate by the first holding member;

(b) moving at least one holding member among the first holding member and the second holding member in at least one direction of the upward direction and the downward direction to hold the substrate by the second holding member instead of the first holding member; and (c) forming a film on the surface of the substrate held by the second holding member by chemical vapor deposition.

4 Claims, 3 Drawing Sheets

(56) References Cited

FOREIGN PATENT DOCUMENTS

| JP | 2000-178743 A | | 6/2000 | |
| JP | 2002-313900 | * | 10/2002 | ............. H01L 21/68 |
| JP | 2003-213429 A | | 7/2003 | |
| JP | 2007-201098 A | | 8/2007 | |
| JP | 2011-9295 A | | 1/2011 | |
| JP | 2013-239579 A | | 11/2013 | |
| JP | 2014-75606 | * | 4/2014 | ........... H01L 21/205 |
| JP | 2017-163022 A | | 9/2017 | |

OTHER PUBLICATIONS

Sedov, Vadim, et al., "Effect of Substrate Holder Design on Stress and Uniformity of Large-Area Polycrystalline Diamond Films Grown by Microwave Plasma-Assisted CVD". Coatings, 2020, 10, 939, pp. 1-10.*

Geng, Chuanwen, et al., "Effect of adding an upper-substrate holder in the quartz-tube MPCVD on plasma parameters". Vacuum, vol. 197, Mar. 2022, 110846.*

Wang, Yurui, et al., "Preparation of diamond on GaN using microwave plasma chemical vapor deposition with double-substrate structure". Functional Diamond, 2023, vol. 3, No. 1, 1-7.*

Office Action dated Jul. 11, 2022 in co-pending U.S. Appl. No. 16/418,142, citing document 1 therein. 9 pages.

Machine translation of JP S50-033184 published Mar. 31, 1975. 2 pages. (Year: 1975).

Machine translation of JP S63-134663 published Jun. 7, 1988. 3 pages (Year: 1988).

Machine translation of JP S61-124572 published Jun. 12, 1986. 3 pages (Year: 1986).

Machine translation of JP H08-100265 published Jun. 16, 1998. 9 pages (Year: 1996.

Japanese Office Action dated Feb. 1, 2022 in Japanese Patent Application No. 2019-0933224. 4 pages.

Office Action dated Feb. 9, 2023, in co-pending U.S. Appl. No. 16/418,142, citing document 1 and 2 therein.

Office Action dated Oct. 5, 2023, in co-pending U.S. Appl. No. 16/418,142.

* cited by examiner

METHOD OF FORMING A FILM ON A SUBSTRATE BY CHEMICAL VAPOR DEPOSITION

CROSS REFERENCE TO RELEATED APPLICATIONS

This application is a divisional application of U.S. application Ser. No. 16/418,142, filed on May 21, 2019, and claims priority to Japanese Patent Application No. 2018-098575, filed on May 23, 2018, which are incorporated herein by reference in their entireties.

FIELD OF THE INVENTION

The present invention relates to a chemical vapor deposition apparatus for forming a functional film or the like on the surface of a substrate and a method of forming a film.

BACKGROUND OF THE INVENTION

Members prepared by forming a film formed of materials such as pyrolytic boron nitride (PBN), pyrolytic carbon (PG), tantalum carbide (TaC), aluminum nitride (AlN), and boron carbide (SiC) on the surface of a substrate to impart functions such as heat resistance and corrosion resistance thereto are widely used in a semiconductor manufacturing apparatus and the like.

For example, a member having high insulation properties, heat resistance, and resistance to thermal shock can be obtained by coating a carbon substrate with the PBN. The PBN is obtained according to a chemical vapor deposition (CVD) method, has properties such as high purity, high strength, anisotropic properties, and high thermal conductivity, and can impart excellent properties inherent to boron nitride (BN) to the carbon substrate. Further, the PBN is difficult to react with many substances, and does not react with metal or a compound even in a low temperature oxidation atmosphere or a high temperature inert gas atmosphere, and thus a material coated with PBN is used as a heater and a susceptor for a metal organic chemical vapor deposition (MOCVD) apparatus.

The PG is chemically stable, and has a high purity, a high thermal stability, impermeable properties, and a high thermal conductivity. The member prepared by coating the carbon substrate with the PG can be used as a high temperature wafer susceptor, a cathode, a MOCVD apparatus parts, an ion implantation apparatus parts, and the like.

The TaC has the highest melting point among transition metal carbides (about 3,900° C.), and is excellent in chemical stability, strength, toughness, and corrosion resistance. A tantalum carbide coating material obtained by coating the surfaces of the carbon substrate and a TaC sintered body with a TaC film is used as a member in an apparatus for producing semiconductor single crystals such as Si, SiC, and GaN. In a case where the TaC sintered body is coated with the TaC film according to the CVD method, it is possible to form a homogeneous, high-purity film that does not contain a sintering aid, thereby improving the functionality.

The AlN is a relatively lightweight ceramic with high insulation and thermal conductivity. Due to the characteristics, the carbon substrate coated with AlN is used for a high thermal conductivity member, a heat resistant part, a corrosion resistant part, a container for melting metal, or the like.

In addition to the characteristics of carbon, the carbon substrate coated with SiC is resistant to physical impact and has rapid local heating resistance. In addition, the carbon substrate coated with SiC can be used even in an oxidizing atmosphere up to about 700° C., and particles such as carbon powder are less likely to be generated therein, and thus it is used for a susceptor for an epitaxial growth apparatus, a susceptor for CVD, a heater or the like.

Such a material is often coated on the entire surface of the substrate to sufficiently exhibit the functionality thereof. However, when a film is formed on the surface of the substrate by the CVD apparatus in the prior art as illustrated in FIG. 5, no film is formed on a portion where a substrate 6 and a substrate holding member 4 are in contact with each other. For this reason, the substrate holding member is designed such that an area where the substrate and the substrate holding member are in contact with each other is as small as possible. However, even when using such a substrate holding member, a film is not formed at the supporting point where the substrate holding member is in contact with the substrate. Thus, in a case where the entire surface of the substrate is coated, it is necessary to change the supporting point and perform film formation a plurality of times. In addition, in this case, there is another problem in that the physical properties become discontinuous at an interface between the first formed film and the second formed film. On the other hand, some proposals to overcome the problem have been made up to now.

PTL 1 discloses that a high frequency heating coil is heated and the substrate is floated by electromagnetic force to form a uniform film on the entire surface of the substrate. However, this method requires a large amount of electric power, and the substrate is limited to light and small ones, and thus it is not suitable as a mass production technology.

In PTL 2, a technology of forming a uniform film by continuously moving the supporting point during the film formation is proposed. Since this method is carried out by suspending a supporting rod through a through hole of the substrate, there is a problem in that the shape of the substrate is limited.

In PTL 3, there is proposed to use a supporting stage coated with pyrolytic carbon or silicon carbide and having a plurality of supporting portions of 10 mm or less in width. In this method, strut marks are reduced, but do not disappear.

In PTL 4, there is proposed to apply a slight shock to a supporting member of a substrate and to coat the substrate while displacing a portion where the substrate and the supporting member are in contact with each other. Thereby, it is possible to coat the entire surface of the substrate by a one film formation, but the friction between the substrate and supporting member causes a problem such as wear or crack of the substrate or the film.

CITATION LIST

Patent Literature

PTL 1: JP 50-33184 A
PTL 2: JP 63-134663 A
PTL 3: JP 61-124572 A
PTL 4: JP 08-100265 A

SUMMARY OF THE INVENTION

Technical Problem

In this regard, according to the present invention, there is provided a chemical vapor deposition apparatus and a method of forming a film which are capable of forming a film on the entire surface of a substrate by one film formation without causing wear or crack of the substrate or the film.

Solution to Problem

As a result of intensive studies, the inventors of the present invention have found that the problem can be solved by providing a first holding member that is capable of holding the substrate and a second holding member that is capable of holding the substrate independently from the first holding member in a chemical vapor deposition apparatus, and making at least one holding member of the first holding member and the second holding member movable in a vertical direction. Thereby, the present invention has been completed. The summary of the present invention is as follows.

[1] A chemical vapor deposition apparatus for forming a film on a surface of a substrate held in a reaction container, wherein a holding device for holding one or more substrates is provided in the reaction container, the holding device has one or more holding structures for holding one substrate, the holding structure includes at least a first holding member that is capable of holding the substrate and a second holding member that is capable of holding the substrate independently from the first holding member, and at least one holding member among the first holding member and the second holding member is movable in a vertical direction.

[2] The chemical vapor deposition apparatus according to the above [1], wherein the first holding member and the second holding member are changeable to each other as a holding member that holds the substrate.

[3] The chemical vapor deposition apparatus according to the above [1] or [2], wherein a position of a supporting point of the substrate being in contact with the holding member is changeable during film formation.

[4] The chemical vapor deposition apparatus according to any one of the above [1] to [3], wherein the holding structure causes the substrate to rotate.

[5] The chemical vapor deposition apparatus according to any one of the above [1] to [4], wherein the holding structure causes the substrate to move in a horizontal direction.

[6] The chemical vapor deposition apparatus according to any one of above [1] to [5], wherein the first holding member and the second holding member are in contact with the substrate at two or more supporting points.

[7] The chemical vapor deposition apparatus according to any one of above [1] to [6], wherein an effective contact area per one supporting point of the first holding member with the substrate and an effective contact area per one supporting point of the second holding member with the substrate each are 20 mm$^2$ or smaller.

[8] A method of forming a film on a surface of a substrate by chemical vapor deposition in a reaction container provided with at least a first holding member that is capable of holding the substrate and a second holding member that is capable of holding the substrate independently from the first holding member, the method including: a first step of forming a film on a surface of the substrate by chemical vapor deposition while holding the substrate by the first holding member; a second step of moving at least one holding member among the first holding member and the second holding member in at least one direction of the upper direction and the lower direction to hold the substrate by the second holding member instead of the first holding member; and a third step of forming a film on the surface of the substrate held by the second holding member by chemical vapor deposition.

[9] The method of forming a film according to the above [8], wherein the first step to the third step are performed during film formation.

Advantageous Effects of Invention

According to the present invention, since a film can be formed on the entire surface of the substrate by one film formation, it is not necessary to perform film formation a plurality of times while changing the supporting points, and thus productivity is improved. In particular, when film formation is performed a plurality of times by the thermal CVD method, time for raising the temperature to a relatively high reaction temperature or lowering the temperature is also required in addition to the film formation time. Therefore, according to the present invention, the productivity is greatly improved particularly in the case of the thermal CVD method.

DESCRIPTION OF EMBODIMENTS

Chemical Vapor Deposition Apparatus

Figure 1:
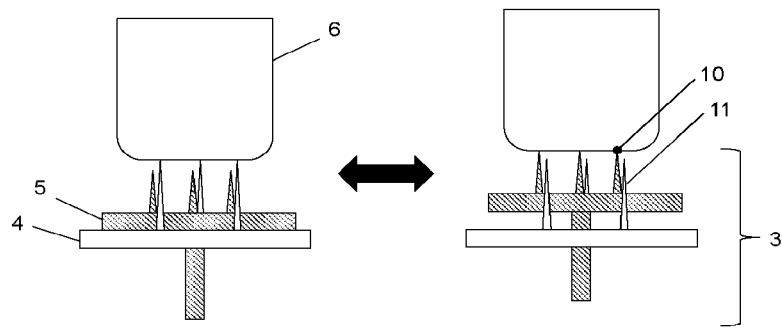
FIG. 1 is a schematic diagram illustrating an example of a holding device in a CVD apparatus according to one embodiment of the present invention.

In a chemical vapor deposition apparatus according to one embodiment of the present invention, a film is formed on a surface of a substrate held in a reaction container, and a holding device for holding one or more substrates is provided in the reaction container. The holding device has one or more holding structures for holding one substrate, and the holding structure includes at least a first holding member that is capable of holding the substrate and a second holding member that is capable of holding the substrate independently from the first holding member. In addition, at least one holding member of the first holding member and the second holding member is movable in a vertical direction. Thereby, in the chemical vapor deposition apparatus according to one embodiment of the present invention, a film can be formed on the entire surface of the substrate by one film formation. Further, it is not necessary to perform the film formation a plurality of times while changing a supporting point, and the productivity is improved. The chemical vapor deposition apparatus according to one embodiment of the present invention will be specifically described below.

The chemical vapor deposition apparatus according to one embodiment of the present invention is a chemical vapor deposition (CVD) apparatus that forms a material such as pyrolytic boron nitride (PBN), pyrolytic carbon (PG), tantalum carbide (TaC), aluminum nitride (AlN), or boron carbide (SiC) into a film on a surface of the substrate held in the reaction container.

With respect to the CVD apparatus according to one embodiment of the present invention, the materials for film formation and kinds and shapes of the substrates can be optionally selected. In addition, the kind of the CVD in the CVD apparatus according to one embodiment of the present invention is not particularly limited, and the CVD apparatus according to one embodiment of the present invention can be applied to the thermal CVD, plasma CVD, and the like.

The CVD method has excellent coverage, and a film having uniform film thickness distribution can be obtained. The thermal CVD method has no concern about damage to the holding device due to the plasma like the plasma CVD method.

From the above viewpoint and the viewpoint point of view that productivity can be greatly improved, the CVD apparatus according to one embodiment of the present invention is preferably a CVD apparatus that forms a film on the substrate surface according to the thermal CVD method.

The holding device for holding one or more substrates is provided in the reaction container of the CVD apparatus according to one embodiment of the present invention. From the viewpoint of production efficiency, it is preferable that the holding device can hold a plurality of substrates.

The holding device has one or more holding structures for holding one substrate. In a case where the holding device holds the plurality of substrates, the holding device is provided with a plurality of holding structures.

Further, the holding structure includes at least a first holding member that is capable of holding the substrate and a second holding member that is capable of holding the substrate independently from the first holding member. Furthermore, the expression of "capable of holding the substrate independently from the first holding member" means that it is possible to hold the substrate by the second holding member without the first holding member. In addition, the holding structure may include another holding member other than the first holding member and the second holding member as long as it has the first holding member and the second holding member. For example, the holding structure may include the first holding member that is capable of holding the substrate, the second holding member that is capable of holding the substrate independently from the first holding member, and the third holding member that is capable of holding the substrate independently from the first holding member and the second holding member.

At least one holding member of the first holding member and the second holding member is movable in the vertical direction. Thereby, the holding member that holds the substrate can be changed between the first holding member and the second holding member. As a result of that, a position of the supporting point of the substrate being in contact with the holding member can be changed during the film formation, and thus it is possible to form a film on the entire substrate surface. Further, it is not necessary to perform the film formation a plurality of times while changing a supporting point, and the productivity is improved.

The holding device provided in the CVD apparatus according to one embodiment of the present invention will be further specifically described with reference to FIG. 1. FIG. 1 is a schematic diagram illustrating an example of a holding device provided in a CVD apparatus according to one embodiment of the present invention. Here, when a second holding member 5 is moved in the upper direction, a substrate 6 held by a first holding member 4 is held by the second holding member 5.

Also, when the second holding member 5 is moved in the lower direction, a substrate 6 held by the second holding member 5 is held by the first holding member 4.

As such, when the second holding member 5 is moved in at least one direction of the upper direction and the lower direction, it is possible to change the holding member holding the substrate 6 between the first holding member 4 and the second holding member 5.

Furthermore, when the first holding member 4 is moved in at least one direction of the upper direction and the lower direction, the holding member holding the substrate 6 may be changed between the first holding member 4 and the second holding member 5. In addition, when the first holding member 4 and the second holding member 5 are moved in at least one direction of the upper direction and the lower direction, the holding member holding the substrate 6 may be changed between the first holding member 4 and the second holding member 5. As such, in the CVD apparatus according to one embodiment of the present invention, when at least one holding member among the first holding member 4 and the second holding member 5 is moved in at least one direction of the upper direction and the lower direction, the first holding member 4 and the second holding member 5 are changeable to each other as the holding member holding the substrate 6.

Here, the expression of "the first holding member 4 and the second holding member 5 are changeable to each other" means that the holding member is changeable from the first holding member 4 to the second holding member 5 or from the second holding member 5 to the first holding member 4, or the holding member is changeable from the first holding member 4 to the second holding member 5 and from the second holding member 5 to the first holding member 4.

A movable mechanism for moving at least one holding member of the first holding member 4 and the second holding member 5 in a vertical direction is not particularly limited.

In this way, since the supporting point of the substrate being in contact with the holding member can be changed during the film formation, it is not necessary to form the film a plurality of times when forming a film on the entire surface of the substrate.

With respect to at least one holding member of the first holding member and the second holding member, the movement in at least one direction of the upper direction and the lower direction, which causes the change of the supporting point of the substrate, is preferably performed a plurality of times during the film formation. This makes it possible to suppress the nonuniformity of the film in the vicinity of the supporting point.

In addition, a position of the substrate when being held by the first holding member and a position of the substrate when being held by the second holding member may be changed in the vertical direction. By moving the position of the substrate in the vertical direction, it can be also expected to improve the uniformity of the entire film.

Boron chloride and ammonia, which are used as raw materials when forming PBN into a film according to the CVD method, have high reactivity sufficient to react even at room temperature, and thus the film tends to be easily formed in the vicinity of a portion where a raw material gas contacts the substrate for the first time, and the gas does not easily flow around a back surface or the like, where a film is difficult to be formed.

On the other hand, although the reactivity of the raw material is not high in TaC, a gas with large atomic weight such as tantalum chloride as a source of tantalum has a higher straight advance property than a gas with small atomic weight such as methane as a source of carbon. Thus, similar to PBN, the gas does not easily flow around a back surface of a complex-shaped substrate and the vicinity of the supporting point forming a narrow space, where a film is difficult to be formed.

Since the gas flow and the contact position between the substrate and the gas can be changed by moving the substrate in the vertical direction during the film formation, the uniformity of the entire film is improved. For this reason, in particular, when forming a film of a material which is difficult to form a film uniformly, such as PBN or TaC, it is preferable to move the substrate in the vertical direction during the film formation.

Further, the holding structure may rotate the substrate or move it in the horizontal direction. Further, the holding structure may move the substrate in the horizontal direction while rotating the substrate. As a result, the gas flow can be changed, so that the uniformity of the entire film can be further improved. For example, the substrate can be moved in the horizontal direction by revolving the holding structure. Also, in order to further improve the uniformity of the entire film, the rotation of the substrate and the movement of the substrate in the vertical direction may be combined, the movement of the substrate in the horizontal direction, and the movement of the substrate in the vertical direction may be combined, or the rotation of the substrate, the movement of the substrate in the horizontal direction, and the movement of the substrate in the vertical direction may be combined.

The first holding member and the second holding member are not particularly limited as long as they can hold the substrate. The holding member has, for example, a plurality of needle-like supporting portions with pointed tips, and the tips can be made in contact with the substrate. In one substrate, the number of supporting points at which the holding member and the substrate are in contact with each other is preferably two or more, and is more preferably three or more and four or less. If the number of supporting points is three or more, the substrate can be held more stably. On the other hand, when the number of supporting points is too large, the portions where the film cannot be formed are increased, which is not preferable.

Each of an effective contact area per one supporting point of the first holding member with the substrate and an effective contact area per one supporting point of the second holding member with the substrate is preferably 20 mm$^2$ or smaller. This effective contact area is desired to be as small as possible in order not to leave supporting marks.

Here, the effective contact area is an area where the substrate is exposed correspondingly to the supporting mark remained in the case where a target material is formed into a film on the surface of the substrate to have a target thickness without changing the supporting point.

In addition, when the effective contact area per one supporting point is too small, there is a concern in that a stress applied to the substrate and the holding member with respect to the contact area is increased, and the substrate is deformed or the holding member is worn. Therefore, the effective contact area per one supporting point is more preferably 1 mm$^2$ or more.

The material on the surface of the holding member is not particularly limited, but the material on the surface of the holding member is preferably the same as the material to be formed into a film on the substrate or the material constituting the substrate. When the material used for the holding member is different from the above materials, there is a concern in that the holding member and the raw material gas react with each other to change a composition of the film to be formed, or the substrate and the film are contaminated by impurities diffused from the holding member.

The CVD apparatus according to one embodiment of the present invention is not particularly limited except for the holding member and the holding device having the holding structure, and may be the same as a general CVD apparatus, and may be optionally designed according to the purpose or need.

Figure 2:
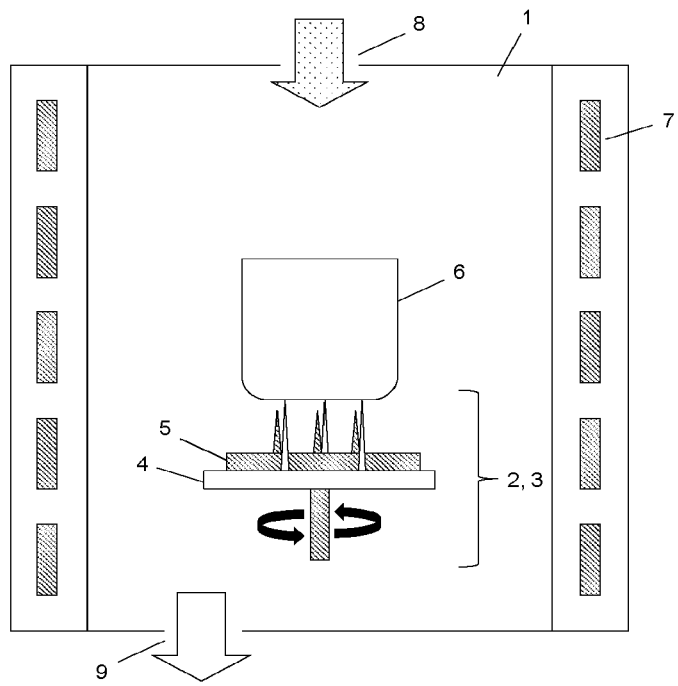
FIG. 2 is a schematic diagram illustrating an example of a reaction container in the CVD apparatus according to one embodiment of the present invention.
Figure 3:
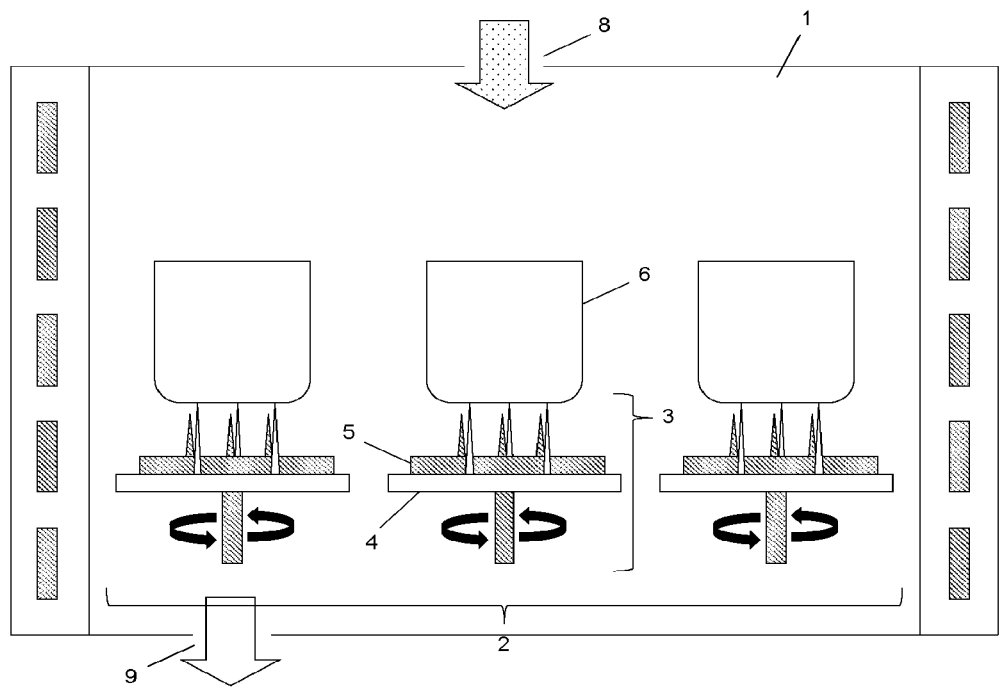
FIG. 3 is a schematic diagram illustrating an example of a reaction container in the CVD apparatus according to one embodiment of the present invention.

The CVD apparatus according to one embodiment of the present invention may be, for example, an external heating type low pressure CVD apparatus. FIGS. 2 and 3 illustrate an example of the external heating type low pressure CVD apparatus. A reaction container 1 is provided with a raw material supply unit 8 and an exhaust unit 9, and further provided with a heater 7.

The raw material supply unit 8 supplies the raw material gas according to the material to be formed into a film. For example, in a case where the material to be formed into a film is PBN, a compound containing a nitrogen atom such as ammonia ($NH_3$) and a boron halide such as boron trichloride ($BCl_3$) are supplied. In a case where the material to be formed into a film is TaC, a compound containing a carbon atom such as methane ($CH_4$) and a tantalum halide such as tantalum pentachloride ($TaCl_5$) are supplied. In a case where the material to be formed into a film is PG, a compound containing a carbon atom such as $CH_4$ is supplied alone. In a case where the material to be formed into a film is AlN, a compound containing aluminum such as trimethylaluminum ($Al(CH_3)_3$) and a compound containing a nitrogen atom such as $NH_3$ are supplied. In a case where the material to be formed into a film is SiC, a compound containing a silicon atom such as silane ($SiH_4$) and a compound containing a carbon atom such as propane ($C_3H_8$) are supplied.

The supplied raw material gas is subjected to thermal CVD reaction under reduced pressure at a high temperature of 900° C. to 1,900° C. and 1 to 100 Pa to form film-form a functional material such as PBN, TaC, PG, AlN, or SiC into a film on the surface of the substrate.

As described above, the CVD apparatus according to one embodiment of the present invention is described, but the CVD apparatus of the present invention is not limited to the CVD apparatus according to one embodiment of the present invention.

Method of Forming Film

According to the present invention, there is provided a method of forming a film on a surface of a substrate by chemical vapor deposition in a reaction container provided with at least a first holding member that is capable of holding the substrate and a second holding member that is capable of holding the substrate independently from the first holding member, the method including: a first step of forming a film on the surface of the substrate by chemical vapor deposition while holding the substrate by the first holding member; a second step of moving at least one holding member among the first holding member and the second holding member in at least one direction of the upper direction and the lower direction to hold the substrate by the second holding member instead of the first holding member; and a third step of forming a film on the surface of the substrate held by the second holding member by the chemical vapor deposition. Thereby, it is possible to form a film on the entire surface of the substrate by one film formation. Further, it is not necessary to perform the film formation a plurality of times while changing a supporting point, and the productivity is improved.

Reaction Container

A reaction container used for the method of forming a film of the present invention is not particularly limited as long as the first to third steps can be performed therewith. As the reaction container used for the method of forming a film of the present invention, for example, the reaction container of the CVD apparatus according to one embodiment of the present invention can be used. Hereinafter, the method of forming a film of the present invention will be described with reference to the reaction container of the CVD apparatus according to one embodiment of the present invention.

First Step

In a first step, a substrate is held by a first holding member to form a film on the surface of the substrate by chemical vapor deposition. Furthermore, the first holding member and the chemical vapor deposition on the substrate surface are the same as those described in the above CVD apparatus according to one embodiment of the present invention, and thus the description thereof will not be repeated.

Second Step

In a second step, a substrate is held by a second holding member instead of the first holding member by moving at least one holding member of the first holding member and the second holding member in at least one direction of an upper direction and a lower direction. Thereby, it is possible to change a position of a supporting point of the substrate being in contact with the holding member. Furthermore, the movement of at least one holding member of the first holding member and the second holding member in at least one direction of the upper direction and the lower direction, and the second holding member are the same as those described in the above CVD apparatus according to one embodiment of the present invention, and thus the description thereof will not be repeated.

Third Step

In a third step, a film is formed on the surface of the substrate held by the second holding member by chemical vapor deposition. Thereby, it is possible to form a film on the substrate surface by the chemical vapor deposition after changing the position of the supporting point of the substrate being in contact with the holding member from the position of the supporting point of the substrate being in contact with the holding member in the first step, and thus the film can be formed on the entire surface of the substrate. Furthermore, the chemical vapor deposition on the substrate surface is the same as those described in the above CVD apparatus according to one embodiment of the present invention, and thus the description thereof will not be repeated.

It is preferable that the first step to the third step are performed during the film formation. Thereby, since a film can be formed on the entire surface of the substrate by one film formation, it is not necessary to form a film a plurality of times while changing the supporting points, and thus productivity is improved. For example, it is preferable to carry out the second step while forming a film on the surface of the substrate by the chemical vapor deposition.

In addition, it is preferable to carry out a process cycle including the first step to the third step a plurality of times during one film formation. This makes it possible to suppress the nonuniformity of the film in the vicinity of the supporting point.

As described above as the reaction container used for the method of forming a film of the present invention, the method of forming a film of the present invention was described with reference to the above reaction container of the CVD apparatus according to one embodiment of the present invention. However, the method of forming a film of the present invention is not limited to the method of forming a film using the CVD apparatus according to one embodiment of the present invention.

EXAMPLES

Hereinafter, the present invention will be more specifically described by way of examples, but the present invention is not limited thereto.

Example 1

First, isotropic graphite formed by cold isostatic pressing (CIP method) was processed into a bottomed cylindrical shape, and six carbon substrates were produced. The carbon substrate had an inner diameter of 180 mm, an outer diameter of 186 mm, and a height of 180 mm.

Next, the six carbon substrates were placed on a holding device in a reaction container of an external heating type low pressure CVD apparatus. This holding device had six holding structures for holding one substrate, and one carbon substrate was placed on each holding structure.

In addition, this holding structure includes two holding members capable of holding a substrate alone, and the carbon substrate is placed on one of the holding members (first holding member). Furthermore, the holding member has three supporting portions with pointed tips, and the carbon substrate is supported being in contact with the tip of each supporting portion (at the supporting point).

In addition, it was confirmed by prior verification that an effective contact area per one supporting point of the holding member with the substrate is 10 $mm^2$.

Furthermore, these holding members are made to be able to move in an opposite phase independently in the vertical direction. Furthermore, "independently" means that these two holding members operate relatively differently in the vertical direction. In addition, two of the holding members that move in opposite phases independently in the vertical direction may obtain a driving force for moving in the vertical direction, for example, from the same rotation system via a gear or the like. It is possible to deliver the carbon substrate from the first holding member to the second holding member by moving the holding member (first holding member) that holds the substrate first in the lower direction, and moving the other holding member (second holding member) in the upper direction. Thereafter, it is possible to deliver the carbon substrate to the first holding member again by moving the holding member (second holding member) that has received the carbon substrate in the lower direction, and moving the holding member (first holding member) that had held the carbon substrate first in the upper direction. Furthermore, a moving distance of the first and second holding members in the vertical direction was 50 mm.

Here, since a portion where the first holding member is in contact with the substrate and a portion where the second holding member is in contact with the substrate are different from each other, it is possible to change the supporting point on the substrate.

Figure 4:
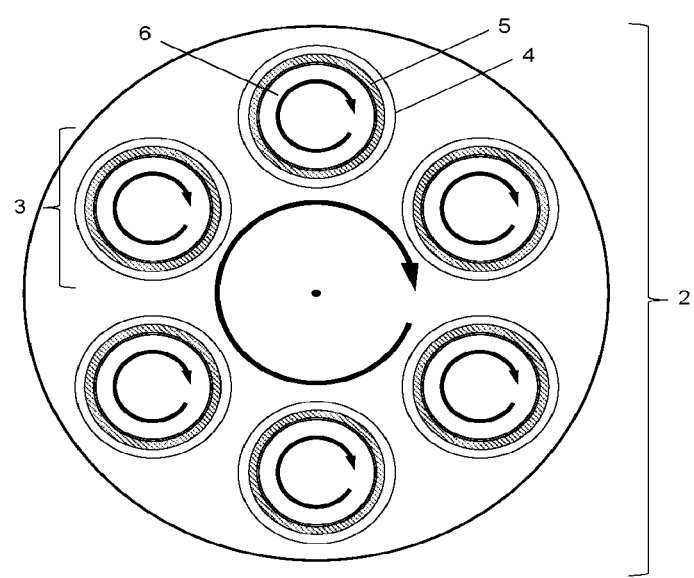
FIG. 4 is a schematic diagram illustrating a movement of a holding structure in the CVD apparatus used in examples.
Figure 5:
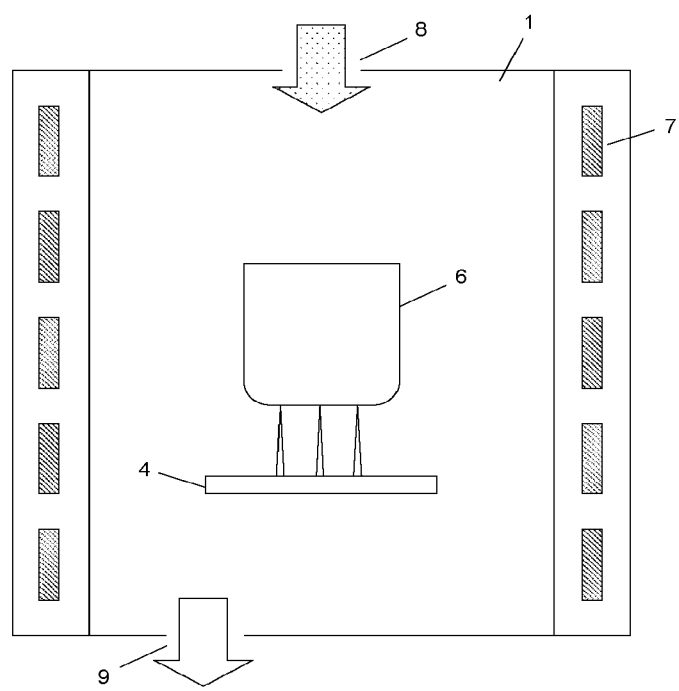
FIG. 5 is a schematic diagram illustrating an example of a reaction container in the CVD apparatus in the prior art.

As illustrated in FIG. 4, each holding structure 3 is capable of rotating, and causes the substrate 6 to rotate. Further, the holding structure 3 revolves around the center of the holding device 2 as a fulcrum, and causes the substrate 6 to revolve.

Here, it was set such that one rotation and one vertical movement of the holding members 4 and 5 (one delivery of the carbon substrate) are performed for one revolution of the holding structure. The revolution speed was 5 rpm.

Subsequently, 20 SLM (standard/liter/minute (1 atm, 0° C.)) of $NH_3$ gas and 5 SLM of $BCl_3$ gas were supplied from a raw material supply unit, the pressure in the reaction container was set to 100 Pa, and the temperature was set to 1,800° C. A 1 mm thick PBN film was formed on the entire surface of the carbon substrate by the chemical vapor deposition. The processing time (including temperature increase and temperature decrease time) from the start to the end of film formation was 25 hours.

Example 2

A PBN coated carbon substrate was produced according to the same method as in Example 1 except that the holding structure stopped the rotation and revolution thereof.

Example 3

A PBN coated carbon substrate was produced according to the same method as in Example 1 except that the effective contact area of the holding member with the substrate was set to 20 $mm^2$.

Example 4

In Example 4, a TaC coated carbon substrate was produced. Here, the effective contact area of the holding member with the substrate was set to 5 $mm^2$. In addition, $TaCl_5$ which was heated to a temperature of 170° C. and vaporized was supplied from the raw material supply unit, together with 0.5 SLM of $CH_4$ gas and 1.5 SLM of delivered Ar gas, and the pressure in the reaction container was set to 50 Pa and the temperature was set to 1,100° C. A 30 μm thick TaC film was formed on the entire surface of the carbon substrate by the chemical vapor deposition. The processing time (including temperature increase and temperature decrease time) from the start to the end of film formation was 22 hours. The other operations were the same as in Example 1.

Example 5

A TaC coated carbon substrate was produced according to the same method as in Example 4 except that the effective contact area of the holding member with the substrate was set to 20 $mm^2$.

Example 6

A TaC coated carbon substrate was produced according to the same method as in Example 4 except that the holding structure stopped the rotation and revolution thereof.

Example 7

In Example 7, a PG coated carbon substrate was produced. Here, the effective contact area of the holding member with the substrate was set to 20 $mm^2$. In addition, 5 SLM of $CH_4$ gas was supplied from the raw material supply unit, and the pressure in the reaction container was set to 200 Pa and the temperature was set to 1700° C. A 50 μm thick PG film was formed on the entire surface of the carbon substrate by the chemical vapor deposition. The processing time (including temperature increase and temperature decrease time) from the start to the end of film formation was 27 hours. The other operations were the same as in Example 1.

Example 8

A PG coated carbon substrate was produced according to the same method as in Example 7 except that the effective contact area of the holding member with the substrate was set to 5 $mm^2$.

Example 9

In Example 9, an AlN coated carbon substrate was produced. Here, the effective contact area of the holding member with the substrate was set to 10 $mm^2$. In addition, $Al(CH_3)_3$ which was heated to a temperature of 30° C. to 80° C. and vaporized was supplied from the raw material supply unit, together with 0.5 SLM of $NH_3$ gas and 2 SLM of delivered Ar gas, and the pressure in the reaction container was set to 50 Pa and the temperature was set to 900° C. A 100 μm thick AlN film was formed on the entire surface of the carbon substrate by the chemical vapor deposition. The processing time (including temperature increase and temperature decrease time) from the start to the end of film formation was 24 hours. The other operations were the same as in Example 1.

Example 10

An AlN coated carbon substrate was produced according to the same method as in Example 9 except that the effective contact area of the holding member with the substrate was set to 20 $mm^2$.

Example 11

In Example 11, a SiC coated carbon substrate was produced. Here, the effective contact area of the holding member with the substrate was set to 10 $mm^2$. In addition, $CH_3SiCl_3$ which was heated to a temperature of 30° C. to 60° C. and vaporized was supplied from the raw material supply unit, together with 2 SLM of $H_2$ gas as a carbon deposition inhibitor and 2 SLM of delivered Ar gas, and the pressure in the reaction container was set to 200 Pa and the temperature was set to 1,100° C. A 30 μm thick SiC film was formed on the entire surface of the carbon substrate by the chemical vapor deposition. The processing time (including temperature increase and temperature decrease time) from the start to the end of film formation was 24 hours. The other operations were the same as in Example 1.

Example 12

A SiC coated carbon substrate was produced according to the same method as in Example 11 except that the effective contact area of the holding member with the substrate was set to 20 $mm^2$.

Comparative Example 1

A PBN coated carbon substrate was produced according to the same method as in Example 1 except that the holding member was one, and was not moved in the vertical direction.

Comparative Example 2

A TaC coated carbon substrate was produced according to the same method as in Example 4 except that the holding member was one, and was not moved in the vertical direction.

Comparative Example 3

A PG coated carbon substrate was produced according to the same method as in Example 7 except that the holding member was one, and was not moved in the vertical direction.

Comparative Example 4

An AlN coated carbon substrate was produced according to the same method as in Example 9 except that the holding member was one, and was not moved in the vertical direction.

Comparative Example 5

A SiC coated carbon substrate was produced according to the same method as in Example 11 except that the holding member was one, and was not moved in the vertical direction.

Comparative Example 6

Regarding the PBN coated carbon substrate produced according to the same method as in Comparative Example 1, the PBN coated carbon substrate was completed by performing the film formation again after changing the supporting point.

Comparative Example 7

Regarding the TaC coated carbon substrate produced according to the same method as in Comparative Example 2, the TaC coated carbon substrate was completed by performing the film formation again after changing the supporting point.

Comparative Example 8

Regarding the PG coated carbon substrate produced according to the same method as in Comparative Example 3, the PG coated carbon substrate was completed by performing the film formation again after changing the supporting point.

Comparative Example 9

Regarding the AlN coated carbon substrate produced according to the same method as in Comparative Example 4, the AlN coated carbon substrate was completed by performing the film formation again after changing the supporting point.

Comparative Example 10

Regarding the SiC coated carbon substrate produced according to the same method as in Comparative Example 5, the SiC coated carbon substrate was completed by performing the film formation again after changing the supporting point.

The following evaluations were performed on the coated carbon substrates of Examples 1 to 12 and Comparative Examples 1 to 10 produced as described above.

Observation of Substrate Exposure

A region of 20 mm×20 mm in the vicinity of the supporting point of the coated carbon substrate was observed with an optical microscope (VHX-200 manufactured by Keyence Corporation) and photographed. Then, the presence or absence of the exposed part on the substrate was examined.

Film Thickness Ratio

Evaluation of the film thickness ratio of the coated carbon substrate having no exposed part was performed. Specifically, in addition to the vicinity of the supporting point of the bottomed cylindrical coated carbon substrate, a region of 20 mm×20 mm on each of the inner side, outer side, inner bottom, and outer bottom was cut out and then cross-sectional SEM observation was performed. The film thickness uniformity was evaluated by calculating the ratio of the minimum film thickness to the maximum film thickness, which were obtained by image analysis. The closer this value is to 1, the better the film thickness uniformity.

Observation of Film Color

A region of 20 mm×20 mm in the vicinity of the supporting point of the coated carbon substrate was observed with an optical microscope (VHX-200 manufactured by Keyence Corporation) and photographed. In addition, regarding the coated carbon substrate having no exposed parts, it was examined whether the film having the same color was formed on the entire surface of the substrate even in the vicinity of the supporting point or there was a difference in color. The difference in color is considered to be due to a slight change in composition.

Area Ratio of Bright Region

An area ratio of a bright region regarding the coated carbon substrate having color difference in the vicinity of the supporting point was measured. Specifically, regarding the region of 20 mm×20 mm in the vicinity of the supporting point which was observed and photographed with an optical microscope, a color space CIELAB value of the film was measured using a spectral color difference meter (RM200QC manufactured by Videojet X-Rite K.K.). The photographed image and the measured CIELAB value were matched by computer color matching. After that, it was converted to grayscale (8 bits) using ImageJ software, and then binarization was performed with a threshold of 100. In addition, the area ratio of the bright region was calculated.

Evaluation results of Examples 1 to 12 and Comparative Examples 1 to 10 are shown in Table 1.

TABLE 1

| | Kinds of films | Vertical movement of holding member | Rotation of holding structure | Revolution of holding structure | Effective contact area [mm$^2$] | Number of film formation [times] | Processing time [h] | Substrate exposure | Film thickness ratio (min/max) | Observation of film color | Area ratio of bright region [%] |
|---|---|---|---|---|---|---|---|---|---|---|---|
| Example 1 | PBN | yes | yes | yes | 10 | 1 | 25 | no | 0.87 | Same color on entire surface | — |
| Example 2 | PBN | yes | no | no | 10 | 1 | 25 | no | 0.34 | Same color on entire surface | — |
| Example 3 | PBN | yes | yes | yes | 20 | 1 | 25 | no | 0.82 | Same color on entire surface | — |

TABLE 1-continued

| | Kinds of films | Vertical movement of holding member | Rotation of holding structure | Revolution of holding structure | Effective contact area [mm²] | Number of film formation [times] | Processing time [h] | Substrate exposure | Film thickness ratio (min/max) | Observation of film color | Area ratio of bright region [%] |
|---|---|---|---|---|---|---|---|---|---|---|---|
| Example 4 | TaC | yes | yes | yes | 5 | 1 | 22 | no | 0.76 | Very small color difference | 100 |
| Example 5 | TaC | yes | yes | yes | 20 | 1 | 22 | no | 0.72 | Slightly small color difference | 100 |
| Example 6 | TaC | yes | no | no | 5 | 1 | 22 | no | 0.43 | Slightly small color difference | 100 |
| Example 7 | PG | yes | yes | yes | 20 | 1 | 27 | no | 0.85 | Same color on entire surface | — |
| Example 8 | PG | yes | yes | yes | 5 | 1 | 27 | no | 0.89 | Same color on entire surface | — |
| Example 9 | AlN | yes | yes | yes | 10 | 1 | 24 | no | 0.85 | Same color on entire surface | — |
| Example 10 | AlN | yes | yes | yes | 20 | 1 | 24 | no | 0.78 | Same color on entire surface | — |
| Example 11 | SiC | yes | yes | yes | 10 | 1 | 24 | no | 0.75 | Same color on entire surface | — |
| Example 12 | SiC | yes | yes | yes | 20 | 1 | 24 | no | 0.73 | Same color on entire surface | — |
| Comparative Example 1 | PBN | no | yes | yes | 20 | 1 | 25 | yes | — | — | — |
| Comparative Example 2 | TaC | no | yes | yes | 20 | 1 | 22 | yes | — | — | — |
| Comparative Example 3 | PG | no | yes | yes | 20 | 1 | 27 | yes | — | — | — |
| Comparative Example 4 | AlN | no | yes | yes | 20 | 1 | 24 | yes | — | — | — |
| Comparative Example 5 | SiC | no | yes | yes | 20 | 1 | 24 | yes | — | — | — |
| Comparative Example 6 | PBN | no | yes | yes | 20 | 2 | 50 | no | 0.41 | Same color on entire surface | — |
| Comparative Example 7 | TaC | no | yes | yes | 20 | 2 | 44 | no | 0.54 | Large color difference | 94 |
| Comparative Example 8 | PG | no | yes | yes | 20 | 2 | 54 | no | 0.45 | Same color on entire surface | — |
| Comparative Example 9 | AlN | no | yes | yes | 20 | 2 | 48 | no | 0.38 | Same color on entire surface | — |
| Comparative Example 10 | SiC | no | yes | yes | 20 | 2 | 48 | no | 0.35 | Same color on entire surface | — |

From the results, in Examples 1 to 12, even with one film formation, it was possible to form a film without exposing the substrate. Therefore, it was possible to significantly shorten a processing time as compared with a case where the film formation is performed twice to coat the entire surface (Comparative Example 6 to 10). In addition, the film thickness uniformity was excellent.

In the TaC film formation, it is considered that a film having 100% area ratio of the bright region was obtained, and a more uniform film was obtained. Furthermore, the uniformity of the film thickness was improved by making the holding structure rotate and revolve, and making the effective contact area smaller.

1: Reaction container
2: Holding device
3: Holding structure
4: First holding member (Substrate holding member)
5: Second holding member
6: Substrate
7: Heater
8: Raw material supply unit
9: Exhaust unit
10: Supporting point
11: Supporting portion

The invention claimed is:

1. A method of forming a film on a surface of a substrate by chemical vapor deposition in a reaction container provided with at least a first holding member that is capable of holding the substrate and a second holding member that is capable of holding the substrate independently from the first holding member, the method comprising:
   (a) forming a film on the surface of the substrate by chemical vapor deposition while holding the substrate by the first holding member;
   (b) moving at least one holding member among the first holding member and the second holding member in at least one direction of the upward direction and the downward direction to hold the substrate by the second holding member instead of the first holding member; and
   (c) forming a film on the surface of the substrate held by the second holding member by chemical vapor deposition.

2. The method of forming a film according to claim 1, wherein steps (a) to (c) are performed during film formation.

3. The method of forming a film according to claim 1, wherein the first holding member has enough height to form a film on an entire surface of the substrate except an area where the tips of the first holding member contact with the surface and the second holding member has enough height to form a film on an entire surface of the substrate except an area where the tips of the second holding member contact with the substrate.

4. The method of forming a film according to claim 2, wherein the first holding member has enough height to form a film on an entire surface of the substrate except an area where the tips of the first holding member contact with the surface and the second holding member has enough height to form a film on an entire surface of the substrate except an area where the tips of the second holding member contact with the substrate.

\* \* \* \* \*